US007823098B1

(12) United States Patent
Moon et al.

(10) Patent No.: US 7,823,098 B1
(45) Date of Patent: Oct. 26, 2010

(54) METHOD OF DESIGNING A DIGITAL CIRCUIT BY CORRELATING DIFFERENT STATIC TIMING ANALYZERS

(75) Inventors: Cho W. Moon, San Diego, CA (US);
Puneet Gupta, Santa Clara, CA (US);
Paul J. Donehue, San Jose, CA (US);
Andrew B. Kahng, Del Mar, CA (US)

(73) Assignee: Tela Innovations, Inc., Los Gatos, CA (US)

( * ) Notice: Subject to any disclaimer, the term of this patent is extended or adjusted under 35 U.S.C. 154(b) by 705 days.

(21) Appl. No.: 11/590,581

(22) Filed: Oct. 31, 2006

(51) Int. Cl.
*G06F 17/50* (2006.01)

(52) U.S. Cl. .................................. 716/4; 716/1; 716/6

(58) Field of Classification Search .................. 716/1, 716/4, 6
See application file for complete search history.

(56) References Cited

U.S. PATENT DOCUMENTS

2005/0066297 A1* 3/2005 Kalafala et al. ................. 716/6

* cited by examiner

*Primary Examiner*—Thuan Do
(74) *Attorney, Agent, or Firm*—Martine Penilla & Gencarella, LLP

(57) ABSTRACT

A method of designing a digital circuit is described, so that it is likely to pass a signoff time test. The method begins with the running of a basic static time test on a partially developed version of the digital circuit, next a signoff time test is run for the partially developed version of the digital system. The differences between the results of the basic static time test and the signoff time test are noted and the prospective basic static time test passing conditions are altered so that if a similar system passes the basic static time test with the altered passing conditions it will be more likely to pass the signoff time test. Then, the partially developed version of the digital system is altered to yield a second partially developed version and the first static time test is run, with the altered passing conditions on the second partially developed version.

7 Claims, 1 Drawing Sheet

METHOD OF DESIGNING A DIGITAL CIRCUIT BY CORRELATING DIFFERENT STATIC TIMING ANALYZERS

FIELD OF INVENTION

The present invention relates to digital and/or electronic circuit designs, and more particularly, to digital and/or electronic circuit design automation.

BACKGROUND

Static timing analysis refers to the method of verifying the timing behavior of a digital circuit without applying exhaustive test patterns. This is usually done by constructing a timing graph to capture the underlying temporal behavior of the digital circuit and analyzing the timing graph for any potential problems or timing violations. The timing graph consists of timing pins and edges that connect the pins. The timing analysis can be done by traversing the timing graph and computing arrival times (AT) of signals relative to some clock signals and required times (RT) at relevant pins. ATs are computed by traversing the timing graph from inputs towards outputs and RTs from outputs towards inputs. The setup slack is defined as RT minus AT. If a signal arrives before (respectively, after) it is required at some pin, the pin is said to have a positive (respectively, negative) slack. Another term used in static timing analysis is "hold slack" defined as AT minus RT, and indicates the margin by which a signal remains present at a particular end point for a particular timing event, after it is needed.

After a digital circuit has been designed, its static timing typically must pass a signoff test. The principal software used for performing a signoff static timing analysis test (henceforth "time test") is Synopsys® PrimeTime® static timing software, although there are other static timing analysis programs that are also used for a signoff test. The signoff software may not be easily available to the circuit designer, and could take as long as a full day to run in the mode which yields the most accurate result. Accordingly, it is not uncommon for the circuit designer to use a basic static timing analysis test that uses less runtime and less expensive software or uses the standard software in a faster running but less accurate mode, as he proceeds through the iterations of his design When the term "time test" is used in this application it means a static timing analysis test done for design development purposes or for static timing analysis signoff Unfortunately, when the circuit is developed to the point where it is ready for the signoff time test, there is a good chance that it will fail because of differences between the basic time test and the signoff time test. When this happens, costly redesign must be performed.

Accordingly, there is a need for a method of using a basic static time test to more accurately guide the effort to develop a digital circuit with an enhanced chance of passing the signoff time test, together with the other criteria the circuit must meet.

SUMMARY

In a first separate aspect, the present invention may take the form of a method of designing a digital circuit, so that it is likely to pass a signoff time test. The method begins with the running of both a basic static time test and a signoff type static time test on a partially developed version of the digital circuit. The differences between the results of the basic static time test and the signoff type static time test are noted and the prospective basic static time test passing conditions are altered so that if a similar circuit passes the basic static time test with the altered passing conditions it will be more likely to pass the signoff time test. Then, the partially developed version of the digital circuit is altered to yield a second partially developed version and the first static time test is run, with the altered passing conditions, on the second partially developed version.

In a second separate aspect, the present invention may take the form of computer readable media having a computer program that, when executed, accepts as input a set of first slacks from a first time test and a set of second slacks from a second time test, of the same digital circuit, and based on differences between said first slacks and second slacks, adjusts the slack by changing required times and/or arrival times for the second time test.

In a third separate aspect, the present invention may take the form of an apparatus that accepts as input a set of first slacks from a first time test and a set of second slacks from a second time test, of the same digital circuit, and based on differences between said first slacks and second slacks, adjusts the slack by changing required times and/or arrival times for the second time test.

Other features of the present invention will be apparent from the accompanying drawings and from the detailed description that follows.

BRIEF DESCRIPTION OF THE DRAWINGS

An exemplary embodiment is illustrated in the drawing. It is intended that the embodiments and figures disclosed herein are to be considered illustrative rather than restrictive.

DETAILED DESCRIPTION

Figure 1:
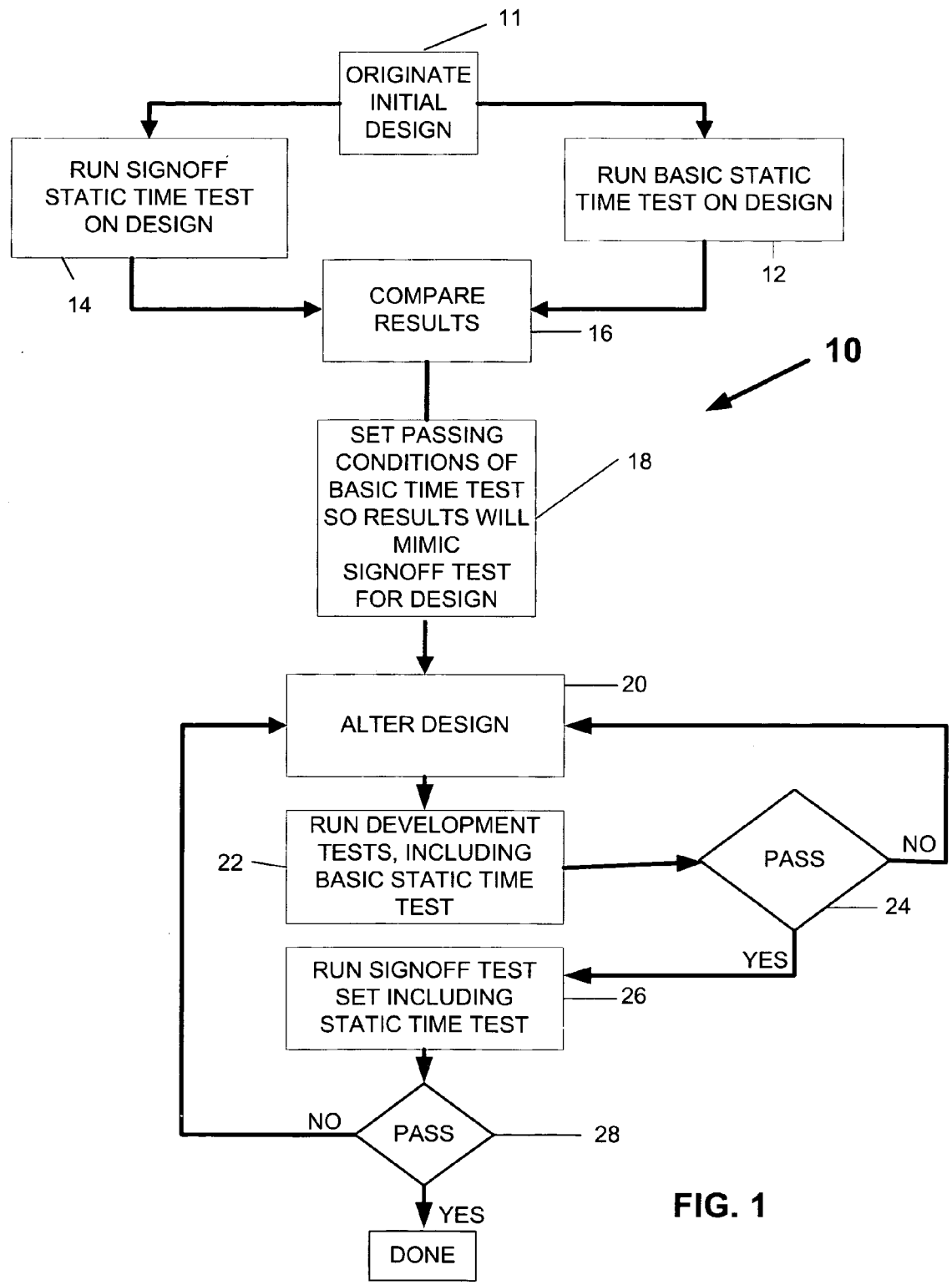
FIG. 1 is a flow diagram of a method of designing digital circuitry so that it is able to pass a signoff time test, according to the present invention.

A preferred embodiment of the present invention may take the form of a method of configuring a static time test ("time test"), for a given digital circuit, so that a passing condition will provide an enhanced indication that a signoff time test will also be passed for the particular digital circuit or a modified version thereof. Referring to FIG. 1, in one embodiment, the method 10 includes originating a preliminary digital circuit (block 11), upon which both a basic time test (block 12) is performed and a signoff type time test (block 14) is also performed, as a reference test. Henceforth the block 14 test is referred to as a "reference test."

The two sets of results are compared (block 16), to create a time delta_time adjust set, noting a set of delta_time adjust values, based on the differences in slack values. This report may be used to adjust each required time (RT) and/or arrival time (AT) of the basic time test (block 18) by the corresponding delta_time adjust value so that passing the basic time test will act as an improved indicator, for further developed versions of the preliminary circuit, that the signoff time test will be passed. The delta time adjustment can be applied to the required time, the arrival time or the combination of both the required time and the arrival time of the basic time test. Although the embodiment described in this invention focuses on required time adjustment, skilled persons will recognize that the same effect could be achieved by arrival time adjustment or a combination of arrival time and required time adjustments to arrive at a set of "corrected slacks." Subsequently, developmental changes are made to the digital circuit (block 20) and a test set is performed (block 22), including the basic time test, to determine if design goals, including slack requirements, are met. If the test set is not passed (decision box 24) the circuit design undergoes further developmental modification (block 20) and is retested (block 22). If the tests are satisfied, the circuit is tested according to the signoff time test (block 26). The possibility of passing the signoff time test (block 26) is enhanced by the process of running the basic time test with modified RTs and/or ATs, for each design iteration. If the signoff test set is passed, the process is over (decision box 28), but if it fails, further design alterations must be performed (block 20).

An apparatus that automatically performs this timing correlation by RT and/or AT adjustment is also described.

In greater detail with respect to block 18, the basic time test is configured by adjusting RTs and/or ATs at endpoints (for instance, primary outputs and/or sequential element input pins) for the preliminary circuit. The RT and/or AT adjustments at the endpoints guarantees for the preliminary circuit, that slacks will match between the two time tests at a given endpoint. Since RTs (respectively, ATs) are propagated backward (respectively, forward) for timing analysis, this also affects slacks at transitive fanin (respectively, fanout) cones of the endpoints. The RT/AT adjustment can be done with respect to, but is not limited to a. early (hold analysis) or late paths (setup analysis),
b. rising or falling transition of the endpoint,
c. source clock signal,
d. rising or falling polarity of the source clock The RT/AT adjustment constitutes another type of timing constraint similar to false paths or multicycle paths that are commonly used in static timing analysis to describe exceptions or special adjustments. A computer instruction for this RT/AT adjustment using the format similar to the industry standard timing constraint format, Synopsys Design Constraint (SDC) is described below:

set_delta_time_adjust-min|-max-rise|-fall-clock
       clock_name\-clock_rise|-clock_fall
       delta_value\endpoint_name -min/max: specifies whether this adjustment applies to min delays (hold) or max delays (setup)
-rise/fall: specifies whether this adjustment applies to the rising/falling transition at the end point
-clock: specifies the relevant clock name for adjustment
-clock_rise/clock_fall: specifies the relevant clock edge
delta_value: desired adjustment value in signed float
endpoint_name: name of primary output port or register input pin to which adjustment should be applied.

RT/AT adjustment can be handled as an extra adjustment during RT/AT computation step which includes but is not limited to a. timing checks (such as setup, hold checks)
b. gated clock checks
c. path delays (set_min_delay, set_max_delay)
d. output delays (set_output_delay)

For example, the RT for a setup check can be computed as

RT=AT@capturing clock pin−setup_value−delta_
       time_adjust

Likewise, the RT for a hold check can be computed as

RT=AT@capturing clock pin+hold_value+delta_
       time_adjust

Persons skilled in the art of static timing analysis will be able to perform the necessary RT computation using the relevant adjustment.

Most time tests support the output of timing reports according to endpoints. Endpoint reports describe, among other things, the path delays and the required times and slacks at all given endpoints. For example, in PrimeTime, one of the most commonly used signoff time tests, the endpoint reports at primary outputs or register data input pins can be generated by the following commands:

set endpoints [add_to_collection [all_registers {-data_p-
       ins}] [all_outputs]]
   report_timing-rise_to $endpoints-max_paths [sizeof_col-
       lection            $endpoints]\-path_type           end-
       nosplit>endpt_rise.rpt
   report_timing-fall_to $endpoints-max_paths [sizeof_col-
       lection            $endpoints]\-path_type           end-
       nosplit>endpt_fall.rpt Note that for best accuracy, rise and fall endpoint reports are generated separately. The endpoint reports can be used to compute the amount of RT adjustment at relevant endpoints. For example, if the reference time test has a slack of 0.5 ns at endpoint X, and the basic time test has a slack of 0.6 ns at the same endpoint, the RT of time test B needs to be adjusted by 0.5-0.6 ns=−0.1 ns to achieve a slack no less than that of the reference time test. The following section describes an algorithm that computes a set of delta_time adjust values automatically by using the endpoint reports. These delta time adjust values can be applied to the RTs, the ATs or the combination of both the RTs and the ATs of the basic time test, as noted above.

Table 1, shown below, presents one algorithm that can create a set of delta_time adjustment values, to modify a basic time (block 18) test so that it will be a better indicator, for a particular circuit and modified versions of the particular circuit, of whether or not a signoff time test will be passed (block 26). This algorithm is presented in pseudo code and is an example. Other algorithms could be used to create other sets of delta time adjustment values having a similar effect on the basic time test. The algorithm accepts inputs from a reference (signoff) time test that provides endpoint reports with timing event info that includes an indication (ref_clock) of which clock is responsible for each endpoint slack. This program generates a slack difference (line 6 slack_diff in TABLE 1) for each responsible reference clock, for each endpoint slack (ep, ref_clock). The delta_time adjustment value (set_delta_time_adjust) is set to the slack difference (line 6 slack_diff in TABLE1) and can be used to change the RTs and/or the ATs of the basic time test, so that passing the basic time test will provide an enhanced indicator that the signoff time test will be passed, for the particular circuit being tested, and modestly altered versions. In this instance, if the slack is worse in the basic time test than in the reference, a relaxing delta time adjustment will be output. The designation "relaxing" anticipates the use of the delta time adjustment in future executions of the basic time test, and in such a way that the basic time test is made easier to pass. To get this result, the required times could be extended (for setup analysis) by the delta time adjust, thereby providing greater leeway for the arrival time. Another approach would be to subtract the delta time adjust from the measured arrival time, which would have the same effect. With either approach, relaxing the basic time test provides greater flexibility for altering the circuit being developed, so that other performance criteria may be met. If the slack is better (greater, for setup analysis) in the basic time test then in the reference time test a tightening delta time adjust will be output, as the basic time test may otherwise give a passing result where the reference time test would give a failing result. Again, this anticipates the use of the delta time adjust in subsequent executions of the basic time test, either in shortening the required time, or as a delta added to the corresponding measured arrival time. With either approach the basic time test is made more difficult to pass.

TABLE 1

```
1.   for each endpoint ep and ref_clock from ref timer {
2.     for each timing event e at ep from test timer{
3.       clock(e) = clock responsible for event e from test timer
4.       if (clock(e) == ref_clock) {
5.         slack(e) = slack at event e from test timer
6.         slack_diff = ref_slack − slack(e)
7.         set_delta_time_adjust(ep, ref_clock, slack_diff)
8.       }
9.     }
10.  }
```

TABLE 2, listed below, shows in pseudo code an algorithm that can be used when the reference timer cannot generate endpoint reports with clock information for each timing event. In this embodiment, the worst slacks of endpoints were made to match between two timers with minimal number of delta time adjustments. To achieve this goal, a tightening delta time adjustment is output (the basic time test is made more difficult to pass) for the worst case basic timer slack (slack(e) in line3 of TABLE 2) for an endpoint, when the slack in the basic timer is better (larger) than the slack in the reference timer (slack_diff<0). Conversely, a relaxing required time adjustment (the basic time test is made easier to pass) is output when the basic timer slack is worse (smaller) than the worst case slack from the reference timer (ref_slack). In an alternative preferred embodiment, the Line 7 (if(slack(e) is the worst slack for ep) is deleted and a tightening delta time adjustment is output for each timing event in which the basic time test slack (slack(e)) is larger than the worst case reference time test slack (ref_slack) by (slack_diff). This embodiment ensures that in the basic time test adjusted worst case slack matches the reference test worst case slack, for every clock event. Because the basic time test has been made more stringent, however, it may be more difficult to optimize for other design goals, in comparison with the case wherein the RT is tightened for only the worst case basic time test slack.

TABLE 2

```
1.   for each endpoint ep from ref timer {
2.     for each timing event e at ep from test timer{
3.       slack(e) = slack at event e;
4.       slack_diff = ref_slack − slack(e);
5.       clock(e) = clock responsible for event e from test timer
6.       if(slack_diff < 0) {
7.         if (slack(e) is the worst slack for ep)
8.           set_delta_time_adjust(ep, clock(e), slack_diff)
9.       } else {
10.        set_delta_time_adjust(ep, clock(e), slack_diff)
```

TABLE 2-continued

```
11.      }
12.    }
13.  }
```

While a number of exemplary aspects and embodiments have been discussed above, those of skill in the art will recognize certain modifications, permutations, additions and sub-combinations thereof. It is therefore intended that the following appended claims and claims hereafter introduced are interpreted to include all such modifications, permutations, additions and sub-combinations as are within their true spirit and scope.

What is claimed is:

1. A computer-implemented method of designing a digital circuit, so that it is likely to pass a signoff time test:
  (a) running a basic static time test on a first partially developed version of said digital circuit;
  (b) running a signoff time test on said first partially developed version of said digital circuit;
  (c) noting differences between the results of said basic static time test and said signoff time test;
  (d) altering prospective basic static time test acceptance conditions according to the noted difference so that a slack of said basic static time test with said altered acceptance conditions substantially matches the slack of said signoff time test;
  (e) altering said first partially developed version of said digital circuit to yield a second partially developed version: and
  (f) running said basic static time test having said altered acceptance conditions on said second partially developed version.

2. The method of claim 1, wherein said signoff time test is performed by Synopsis® PrimeTime®.

3. The method of claim 1, wherein said basic static time test is a setup time test.

4. The method of claim 3, wherein said basic static time test has as inputs a set of setup slacks and wherein said basic static time test acceptance conditions are altered by adjusting at least one of said setup required times and/or arrival times.

5. The method of claim 1, wherein said basic static time test is a hold time test.

6. The method of claim 5, wherein said basic static time test has as inputs a set of hold slacks and wherein said basic static time test acceptance conditions are altered by adjusting at least one of said hold required times and/or arrival times.

7. The method of claim 1, further including running a signoff time test, if the test of step (f) is passed.

* * * * *